US010236695B2

(12) United States Patent
Weyen

(10) Patent No.: US 10,236,695 B2
(45) Date of Patent: Mar. 19, 2019

(54) CONNECTIVITY CHECK BETWEEN CELLS AND WIRING CONTROL ELECTRONICS WITH ONLY ONE SWITCH

(71) Applicant: VITO NV, Mol (BE)

(72) Inventor: Dominique Weyen, Mol (BE)

(73) Assignee: VITO NV, Mol (BE)

( * ) Notice: Subject to any disclaimer, the term of this patent is extended or adjusted under 35 U.S.C. 154(b) by 0 days.

(21) Appl. No.: 16/062,179

(22) PCT Filed: Dec. 21, 2016

(86) PCT No.: PCT/EP2016/082260
§ 371 (c)(1),
(2) Date: Jun. 14, 2018

(87) PCT Pub. No.: WO2017/109006
PCT Pub. Date: Jun. 29, 2017

(65) Prior Publication Data
US 2018/0375348 A1    Dec. 27, 2018

(30) Foreign Application Priority Data
Dec. 22, 2015 (EP) .................................... 15202123

(51) Int. Cl.
*G01R 31/02* (2006.01)
*G01R 31/44* (2006.01)
(Continued)

(52) U.S. Cl.
CPC .......... *H02J 7/0026* (2013.01); *H02J 7/0019* (2013.01); *H02J 7/0024* (2013.01); *H02J 7/0036* (2013.01)

(58) Field of Classification Search
CPC .................................................. G01R 31/026
(Continued)

(56) References Cited

U.S. PATENT DOCUMENTS 5,254,930 A   10/1993 Daly
5,666,040 A    9/1997 Bourbeau
(Continued)

FOREIGN PATENT DOCUMENTS

DE   102007045836 A1   4/2008
EP       2302757 A1    3/2011
(Continued)

OTHER PUBLICATIONS

International Search report for PCT/EP2016/082260 dated Mar. 23, 2017.
(Continued)

*Primary Examiner* — Edward Tso
*Assistant Examiner* — Ahmed Omar
(74) *Attorney, Agent, or Firm* — Bacon & Thomas, PLLC

(57) ABSTRACT

A connectivity check for a rechargeable energy storage system including a string of rechargeable energy storage cell modules in series. Each cell module has an individual rechargeable energy storage cell or plurality of rechargeable energy storage cells, a switch for use in a connection check, a monitoring and control circuit adapted for measuring a cell module voltage, a single common connection between a terminal of a rechargeable energy storage cell and the monitoring and control circuit within each module. To perform the connectivity check the switch is opened in one module, a cell voltage is measured in the module to give a first measured value, the switch is closed. The cell voltage is measured again to provide a second measured value, and a determination is made if there is a difference between the first and second measured values which would indicate a bad connection.

20 Claims, 7 Drawing Sheets

(51) Int. Cl.
*G01R 31/36* (2006.01)
*H02J 7/00* (2006.01)

(58) Field of Classification Search
USPC .......................................................... 320/116
See application file for complete search history.

(56) References Cited

U.S. PATENT DOCUMENTS

| | | | |
|---|---|---|---|
| 6,844,703 B2 | 1/2005 | Canter | |
| 2011/0316549 A1* | 12/2011 | Coenen | G01R 31/026 324/434 |
| 2013/0038290 A1 | 2/2013 | Chatroux et al. | |
| 2017/0117596 A1* | 4/2017 | Kubo | G01R 31/3658 |

FOREIGN PATENT DOCUMENTS

| | | |
|---|---|---|
| EP | 2787594 A2 | 10/2014 |
| WO | 2011/158051 A1 | 12/2011 |
| WO | 2012/008509 A1 | 1/2012 |

OTHER PUBLICATIONS

Written Opinion for PCT/EP2016/082260 dated Mar. 23, 2017.
European Search Report for corresponding EP 15202123.4-1804 dated Jun. 6, 2016.

\* cited by examiner

CONNECTIVITY CHECK BETWEEN CELLS AND WIRING CONTROL ELECTRONICS WITH ONLY ONE SWITCH

The present invention relates to a rechargeable energy storage system with cells and a method of carrying out a connectivity check.

BACKGROUND

Energy Cells such as rechargeable energy storage devices, e.g. ultracapacitors, supercapacitors, Licaps, batteries, fuel cells are usually placed in series to reach a higher DC voltage.

A cell can be an individual Cell (1 Ultracap, 1 Licaps, or 1 battery cell, 1 fuel cell, etc) or can also be a series of more cells (e.g. 4 liCaps, 4 Ultracaps, . . . or 6 or 8 . . . ).

In battery management systems the voltage can be measured of the individual cells or from a few cells in series. For measuring the voltage there is preferably a trustworthy connection between the electronics and the cells.

A rechargeable energy storage device can comprise a power source, a string of cell modules in series, and a set of balancing/monitoring circuits, one per module as shown in FIG. 1. Each cell module can comprise an individual cell or a series of cells. A switch is controlled in the primary of a transformer and decides when a module has to be balanced. The cell voltage is measured, for example through an AD converter.

The numbering of the connections X.Y to a cell module in the figures is as follows:
1.X is the connection to the minus electrode of module X
2.X. is the connection to the plus electrode of module X
3.X− is the connection of the negative electrode of module X to the balancing circuit
3.X+ is the connection of the positive electrode of module X to the balancing circuit.

The cell modules 12.1, 12.2, 12.3, 12.4 each contain a monitoring and control circuit 15.1 . . . 15.4 respectively, a switch SW.1, . . . SW.4, filter F.1 . . . F.4 such as an inductor and a filter circuit FC.1 . . . FC.4. The monitoring and control circuit (15.1 . . . 15.4) for example implemented as a microcontroller, is adapted to measure the cell module voltage of the cell associated with the module. Each module usually has a filter circuit (FC.1 . . . FC.4) connected to the analog input P+, and filter F.1 . . . F.4 connected to the analog input P− of the monitoring and control circuit (15.1 . . . 15.4).

The numbers 11, 21, 31 and N1 refer to galvanic isolation between a power source and an input to each module 12 and its switch SW.

The voltage on the input V after the galvanic isolation 11, 21, 31 and N1 must be higher than the cell voltages. Switch SW (SW1 . . . SW4) is a switch that can be used for active balancing systems. When switch SW is closed the cell module is charged to voltage V.

U.S. Pat. No. 5,254,930 A discloses a Fault detector for a plurality of batteries in battery backup systems. Here are 2 switches used at the primary of a transformer (not on the side of the cells) in the charge circuit. The voltage and current to the cells are measured and if a fault condition is measured (to high charge current to the cell, . . . ) the switches from the charger are going in shutdown.

U.S. Pat. No. 5,666,040 A discloses a Networked battery monitor and control system and charging method. The voltage is measured and at overvoltage a bypass resistor is switched with a switch to discharge the cell. This switch can't be used for a connection check.

U.S. Pat. No. 6,844,703 B2 discloses a Battery cell balancing system wherein preferential charging occurs for a cell with the lowest state of charge. At least one current limiting device is electrically coupled to transformer/rectifier circuits and a power supply. The current limiting device buffers a source voltage from a reflected voltage of at least one of the plurality of cells. A method of performing the same is also provided.

SUMMARY OF THE INVENTION

One aspect embodiments of the present invention provides a rechargeable energy storage system comprising a string of rechargeable energy storage cell modules in series, each rechargeable cell module comprising:
connections to the individual rechargeable energy storage cell or plurality of rechargeable energy storage cells, the connections allowing the individual rechargeable energy storage cell or plurality of rechargeable energy storage cells to be connected to the module,
a controllable switch for use in a connection check,
a monitoring and control circuit adapted for measuring a cell module voltage, and
at least one filter circuit,
the rechargeable energy storage system further comprising:
a single common connection between a terminal of a rechargeable energy storage cell and the monitoring and control circuit within each module,
wherein the rechargeable energy storage system is adapted such that when all connections of the rechargeable energy storage system are intact, there is no change in voltage measurements through the monitoring and control circuit when the controllable switch is open and when the controllable switch is closed, whereas a deviation in the voltage measurements measured by the monitoring and control circuit when the controllable switch is open and closed is an indication of a bad connection.

The system can also be configured to assess whether a voltage difference has a magnitude indicative of a bad or faulty connection, e.g. rather than of an insignificant difference.

Once connected an individual rechargeable energy storage cell or plurality of rechargeable energy storage cells becomes or become part of a module. Generally, in operation the plurality of rechargeable energy storage cells will be connected in the modules. When the switch is closed the filter circuit is charged in case of a bad connection. This contributes to the magnitude of the deviation of the voltage. This is also the case when the cell voltage=0 V, e.g. the rechargeable energy storage device is an ultracapacitor. If a connection is bad, a significant difference between the voltage measurements is observed. Because the filter circuit of the present invention is charged when there is a bad or faulty connection, the full range from 0 volts to the maximum allowable cell voltage, can be detected.

Switch activation time is advantageously not very long. The capacity of the monitor cell which comprises an ultracapacitor, or one or more battery cells, is so large that for a time that the controllable switch is on that is required for a measurement to be made, no significant difference is observed between the cell voltage with open switch and the cell voltage with closed switch so that the rechargeable energy storage cell is not charged to a significant amount, i.e. for a voltage change. A typical value would be that the switch is closed for 400 microsec with a maximum charge current being 200 mA. Such a small charging energy would make no change to the cell voltage. The system can be provided without the rechargeable energy storage cells connected and the system can be configured to work with the rechargeable energy storage cell that is to be used. Hence the controllable switch can be set to the appropriate closing time.

All the switches of the cell modules can be closed at the same time and all the monitoring and control circuits of the cell modules can measure the cell voltages with the switches open. This allows a very rapid test of all cells.

The switch is preferably controllable and can be used to control when a module having a cell connected is to be balanced as well can be used during testing for bad or faulty connections.

In the system the single common connection is connected between a terminal of a rechargeable energy storage cell and two analog inputs of two monitoring and control circuits in different modules.

A filter can be connected between the switch and an analog input of a module.

Bad connections are selected from a bad connection in the single common connection and a bad connection in a terminal of a cell.

A power source can be provided, the power source being connected to an input of each module and the switch. The power source can either be integral with the system or provided as an extra component.

A means for galvanic isolation can be provided between the power source and the input of each module and its switch.

The switch can be a controllable switch for transfer of charge from the power source to the cell associated with the module where the switch is located.

The filter circuit can be an inductor connected between the switch and an analog input to the module where the switch is located.

Embodiments of present invention provide a method of performing a connectivity check in a rechargeable energy storage system comprising a string of rechargeable energy storage cell modules in series, each rechargeable energy storage cell module comprising:
connections for an individual rechargeable energy storage cell or plurality of rechargeable energy storage cells to be connected to the rechargeable energy storage cell module,
a controllable switch for use in a connection check,
a monitoring and control circuit adapted for measuring a cell module voltage, the rechargeable energy storage system further comprising:
a single common connection between a terminal of a rechargeable energy storage cell and the monitoring and control circuit within each module, the method comprising for each module:
the switch is opened in one module,
measure a cell voltage in the module to give a first measured value,
close the switch,
measure the cell voltage to provide a second measured value, and
determine if there is a voltage difference between the first and second measured values.

The method also includes assessing whether a voltage difference has a magnitude indicative of a bad or faulty connection, e.g. rather than an insignificant difference. Once connected an individual rechargeable energy storage cell or plurality of rechargeable energy storage cells becomes or become part of a module. Generally, in operation the plurality of rechargeable energy storage cells will be connected in the modules. When the switch is closed the filter circuit is charged in case of a bad connection. This contributes to the magnitude of the deviation of the voltage. This is also the case when the cell voltage =0 V, e.g. the rechargeable energy storage device is an ultracapacitor. If a connection is bad, a significant difference between the voltage measurements is observed. Because the filter circuit of the present invention is charged when there is a bad or faulty connection, the full range from 0 volts to the maximum allowable cell voltage, can be detected.

Switch activation time is advantageously not very long. The capacity of the monitor cell which comprises an ultracapacitor, or one or more battery cells, is so large that for a time that the controllable switch is on that is required for a measurement to be made, no significant difference is observed between the cell voltage with open switch and the cell voltage with closed switch so that the rechargeable energy storage cell is not charged to a significant amount, i.e. for a voltage change. A typical value would be that the switch is closed for 400 microsec with a maximum charge current being 200 mA. Such a small charging energy would make no change to the cell voltage. The system can be provided without the rechargeable energy storage cells connected and the system can be configured to work with the rechargeable energy storage cell that is to be used. Hence the controllable switch can be set to the appropriate closing time for the rechargeable energy storage cell selected.

All the switches of the cell modules can be closed at the same time and all the monitoring and control circuits of the cell modules can measure the cell voltages with the switches open. This allows a very rapid test of all cells.

The voltage difference is indicative of a bad connection and an action can be carried out once the bad connection is discovered. For example the action can be a report of the defective cell number, storing of information about the defective cell, or activating an alarm.

The bad connections, which can be detected, can be any of:
a bad connection in the single common connection and a bad connection in a terminal of a cell.

Embodiments of the present invention provide a computer program product comprising software code segments, which when implemented on a processing engine, executes any of the methods of embodiments of the present invention.

A non-volatile machine readable signal storage device such as an optical disk, a magnetic disk, solid state memory or magnetic tape can be provided with the computer program product stored thereon.

Advantages of this System and/or Method
- Checking the connection between the cells and the measuring electronics but also checking the connection between the cells
- Connection test can be made with cell voltage=0 Volt, for example those modules with ultracapacitors so that systems comprising ultracapacitors or batteries can be checked. Ultracapacitors can go low in voltage, even to 0 V, but can be controlled in the full range of an open connection within their full voltage limits. Because the filter circuit of the present invention is charged when there is a bad or faulty connection, the full range from 0 V to the maximum allowable cell voltage can be detected.
- The connection check can made with only 1 switch
- An active balancing switch can be used for connection check Increase security by monitoring the connection between the cells at start up.

Recognition if the connection error is to the electronics or connection error is between the cells.

A broken connection to the electronics could also be a fuse control (if a fuse is placed on the monitoring and control device).

BRIEF DESCRIPTIONS OF THE DRAWINGS

FIG. 1 a schematic representation of a rechargeable energy storage device with cell modules linked in series.

DETAILED DESCRIPTION OF THE INVENTION

Figure 1:
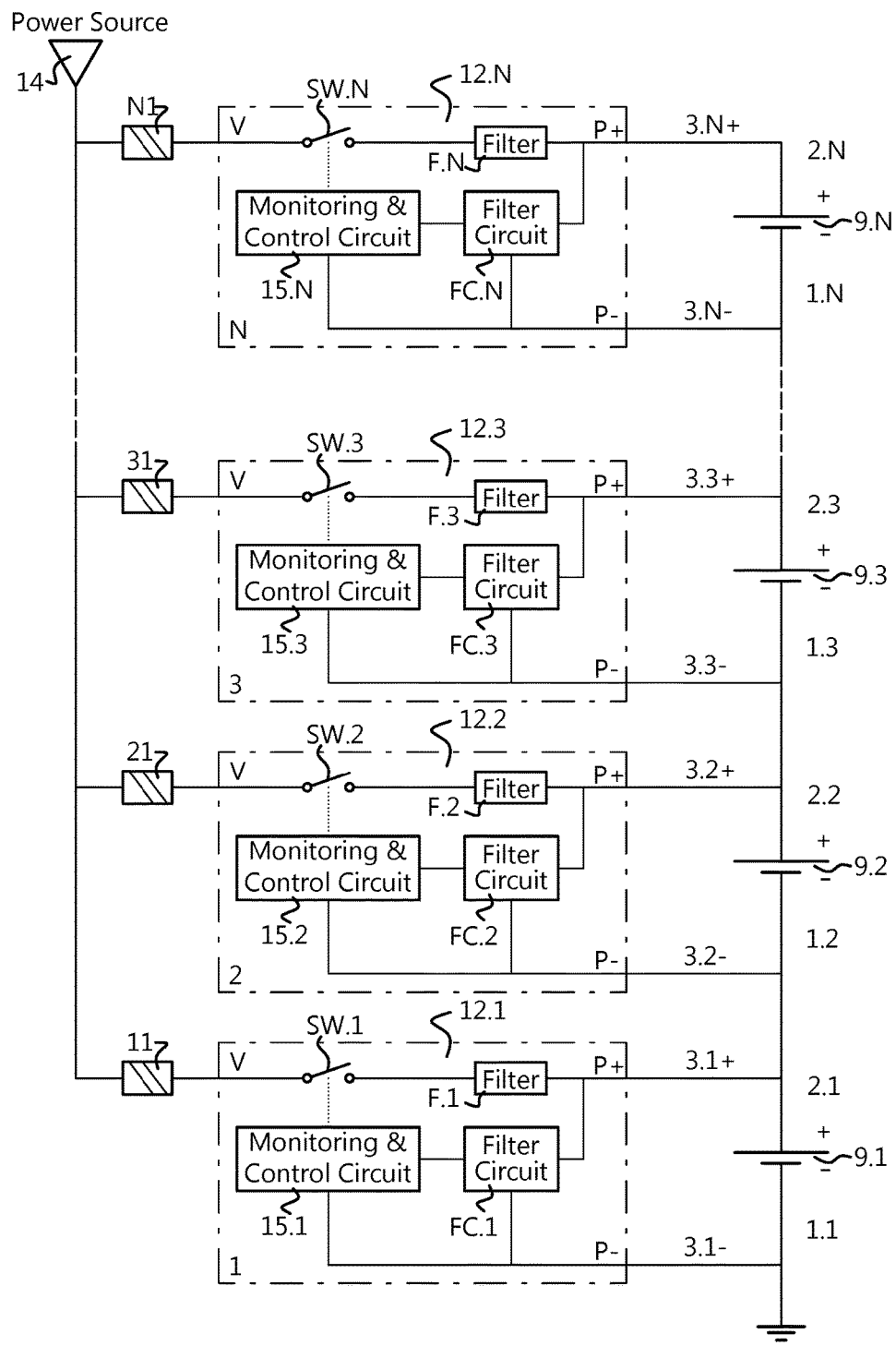

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions unless it is specifically stated as such. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

References to logic, hardware, processor or circuitry can encompass any kind of logic or analog circuitry, integrated to any degree, and not limited to general purpose processors, digital signal processors, ASICs, FPGAs, discrete components or transistor logic gates and so on.

Figure 2:
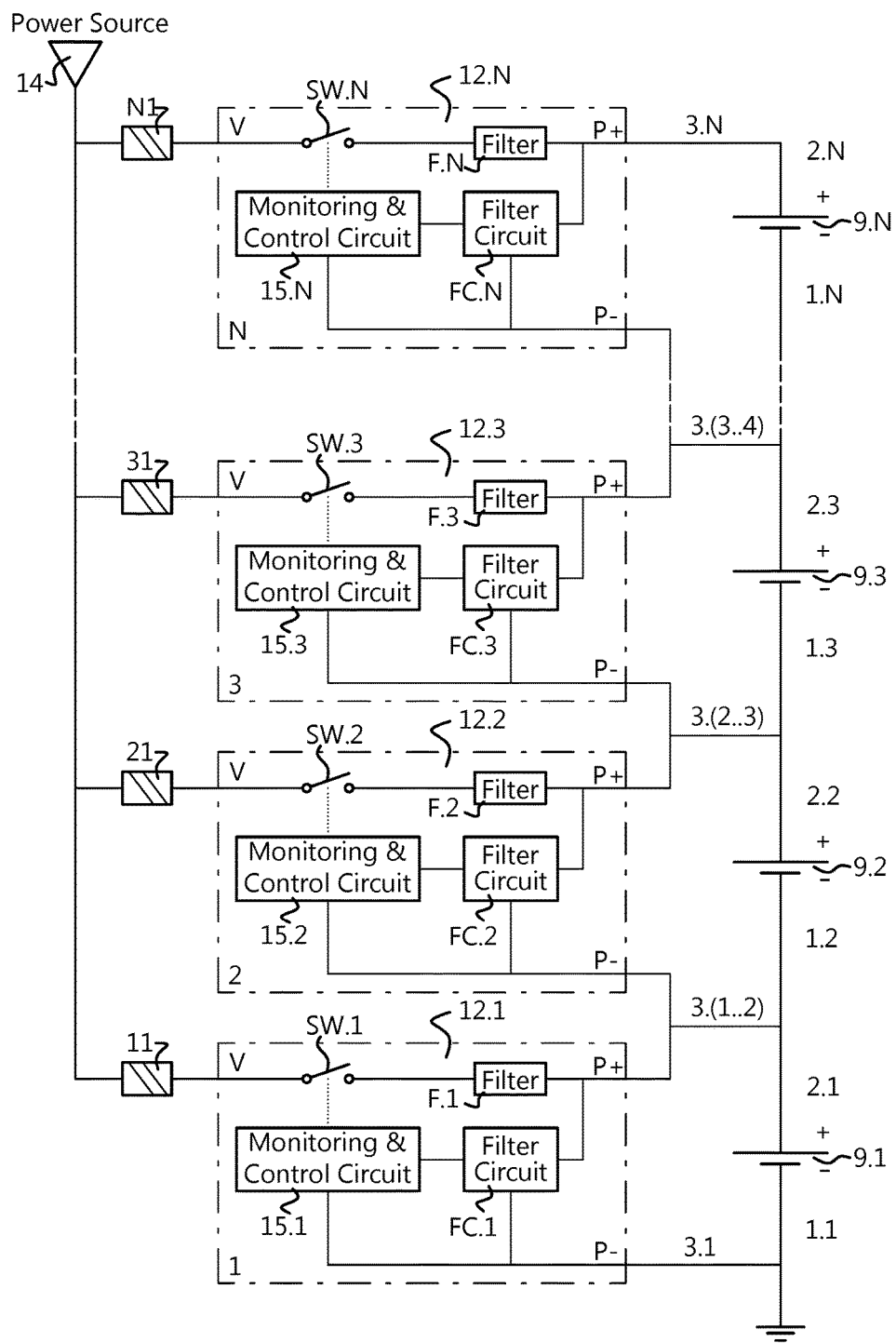
FIG. 2 is a schematic representation of a rechargeable energy storage device according to an embodiment of the present invention with cell modules linked in series with a common connection (only 1 wire) between a cell pole and a monitoring and control circuit.

FIG. 2 illustrates a rechargeable energy storage system 10 according to embodiments of the present invention, comprising a series string of a plurality of energy storage modules 12, each comprising one or more rechargeable energy storage cells 9. The energy storage modules 12 are rechargeable. Each or any one energy storage module 12 can comprise a single energy storage cell 9 or a parallel connection of multiple energy storage cells (not illustrated) 9. The series-connected rechargeable energy storage modules 12 together form a battery, a pack or a stack. In accordance with embodiments of the present invention, the rechargeable energy storage modules 12 may include any type of rechargeable energy storage device. Modules and methods of embodiments of the present invention are advantageously used with ultracapacitors or lithium batteries. According to particular embodiments of the present invention, the energy storage modules 12 may include ultracapacitors, also known as supercapacitors or electric or electrochemical double-layer capacitors (EDLCs). These are electrochemical capacitors that have an unusually high energy density when compared to common capacitors; typically on the order of thousands of times greater than a high capacity electrolytic capacitor. Typical capacitance values may range from a few farads to a few thousands of farads. In alternative embodiments, the rechargeable energy storage modules 12 may include battery cells, for example high energy-density battery cells, such as for example Lithium or Lithium Ion (LiIon) battery cells. Other kinds of rechargeable energy storage modules can equally be used such as fuel cells or flow batteries. Preferred applications are in the fields of energy smoothing and momentary load devices, which require very high instant powers compared to the average power ratings.

In accordance with embodiments of the present invention, each rechargeable energy storage module 12 can have a limited range of allowed operating voltages, e.g. between 2 and 4 V. In order to obtain a useful operating voltage of, for example, a few tens to a few hundreds of Volts or even more, useful e.g. as an energy source in vehicle applications, a plurality, and sometimes a large number of rechargeable energy storage modules 12 need to be coupled in series. A rechargeable energy storage system 10 according to embodiments of the present invention can include, if required, a system for balancing charge over the plurality of rechargeable energy storage modules 12.

An AC signal generator 14 can be provided for charging or discharging one or more of the plurality of rechargeable energy storage modules 12. Each module 12 includes a monitoring and control unit 15.

Each cell 9 of an energy storage module 12 is provided with a first terminal 2.1, 2.2, 2.3, 2.4 which is its positive terminal, and a second terminal 1.1, 1.2, 1.3, 1.4 which is its negative terminal. The energy storage modules 12 are coupled in a string such that a positive terminal 2.1, 2.2, 2.3, 2.4 of a first energy storage cell 9.1 . . . 9.4 is coupled to a negative terminal 1.1, 1.2, 1.3, 1.4 of a second energy storage cell 9.1 . . . 9.4, and so on. At least the negative terminal 1.1 of the very first energy storage module 12.1 in the string, and the positive terminal 2.4 of the very last energy storage module 12 in the string are accessible from external.

In accordance with embodiments of the present invention rechargeable energy storage modules 12 are linked in series with a common connection (only 1 wire) between appositive cell terminal 2.1, 2.2, 2.3, 2.4 and the input P+ of its own module 12 and an input P− of an adjacent module, whereas a negative cell terminal 1.1, 1.2, 1.3, 1.4 is connected to the input P− of its own module 12 and an input P+ of a different adjacent module.

The monitoring and control unit 15 is adapted for measuring an instantaneous electrical parameter of the associated energy storage module 12, e.g. the voltage across the P+ and P−. In order to obtain this, the monitoring and control unit 15 is provided with suitable measurement circuitry. In an embodiment of the present invention, this measurement circuitry can be an analog input of an analog to digital converter in the balancing and monitoring unit 15.

Each module 12 according to embodiments of the present invention furthermore comprises an input terminal V for receiving an input signal. This input terminal is electrically connected, over a switch SW to one input P+ of the inputs P+, P− of module 12. The input signal V is received from an AC signal generator 14. Actuation of the switch SW can be controlled by the monitoring and control unit 15. In accordance with this embodiment of the present invention, a measuring circuit may digitize the measured values, e.g. voltages and store them. The measured parameter value, e.g. voltage, when the switch SW is closed and when it is open will not differ if the connections are satisfactory. If this comparison identifies a difference then this is an indication that there is a poor, bad or faulty connection.

Switch SW can be an active switch. Examples of active switches can be T IACs or transistors such as bipolar transistors, MOSFETs.

The monitoring and control circuit 15 has the function to control the switch SW (SW.1 . . . SW.4). With switch SW it is possible to check for good connections with each monitoring and control circuit (15.1 . . . 15.4) and the modules 12.1 . . . 12.4, e.g. connections 3.1−, 3.1+,3.2−, 3.2+, . . . ) or 3.1, 3.(1 . . . 2), 3.(2 . . . 3) . . . )) and the cells but also to check the connection between the cells (9.1; 2.1;1.2; 2.2 . . . ).

In all or any of the embodiments of the present invention, the switches SW can be controllable switches, i.e. electronically controllable such as TIACs or transistors such as bipolar transistors, or MOSFETs. The closed time for these switches can be set, e.g. by a user.

According to embodiments of the present invention, all modules 12 can be coupled to the AC signal generator 14. This AC signal generator 14 can be provided with the system or purchased separately. This AC signal generator 14 can be a block wave generator, a sinusoidal signal source, a saw tooth generator, or any other type of AC signal generator. It is advantageous if the AC signal generator 14 is a high frequency signal generator, as this reduces component size. A sinusoidal signal generator is more efficient, has lower peak currents hence lower heat generation, and does not substantially present any switching losses. However, a block wave generator is easier to implement than a sinusoidal signal generator. The AC signal generator 14 can be powered from an external source (not illustrated), e.g. a charger. The AC signal generator 14 can be controlled by a main controller 20. It is advantageous to have a single AC signal generator 14 for all of the modules 12. Between the switch SW and the positive pole of a cell a filter element F.1 . . . F.4 can be placed, for example an inductor.

Figure 3:
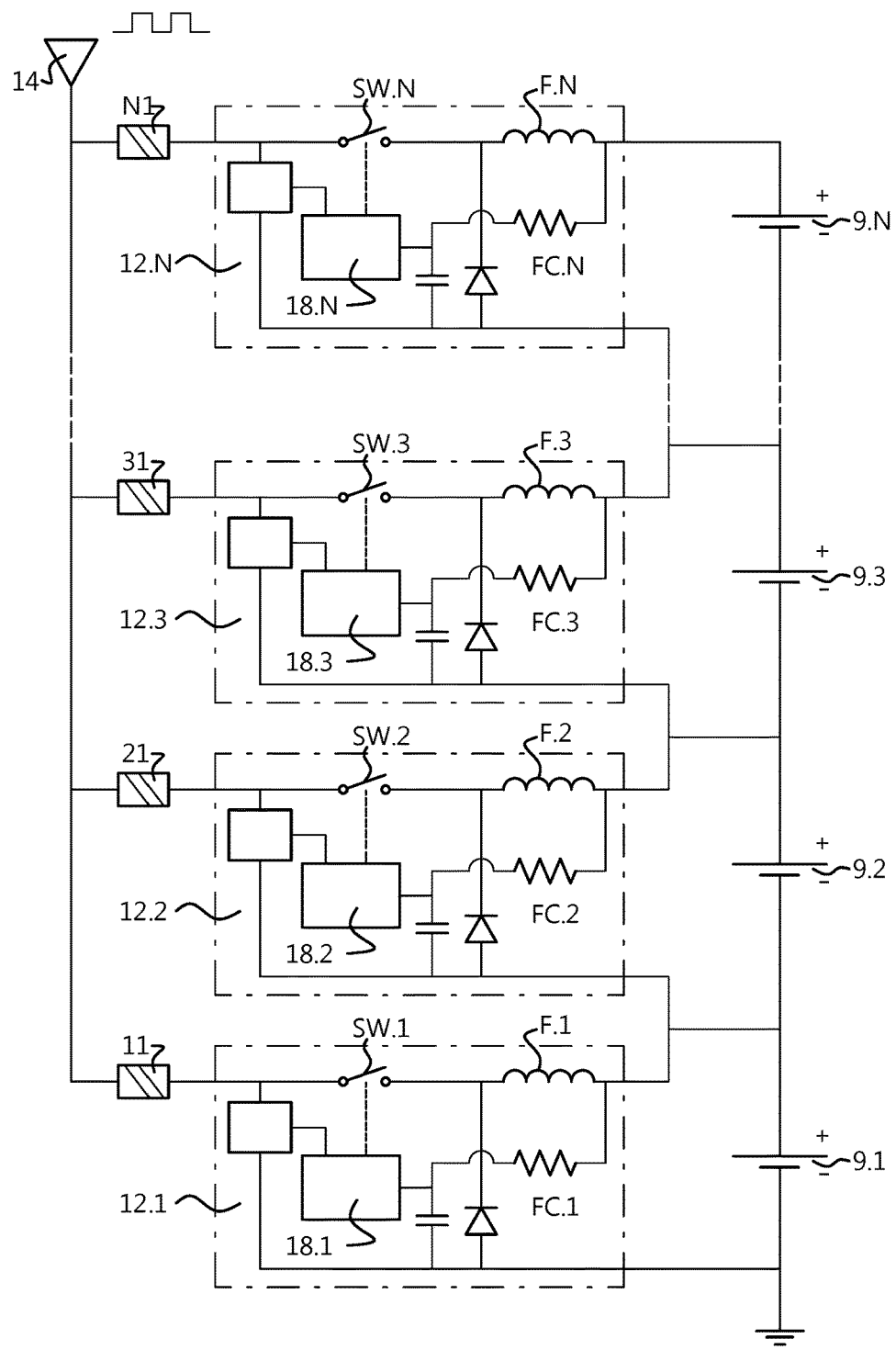
FIG. 3 is a schematic representation of a rechargeable energy storage device according to another embodiment of the present invention with cell modules linked in series with a common connection (only 1 wire) between a cell pole and a monitoring and control circuit.

A rechargeable energy storage system 10 according to another embodiment of the present invention is schematically illustrated in FIG. 3. In FIG. 3 rechargeable energy storage modules 12 are linked in series with a common connection (only 1 wire) between a positive cell terminal 2.1, 2.2, 2.3, 2.4 and the input P+ of its own module 12 and an input P− of an adjacent module, whereas a negative cell terminal 1.1, 1.2, 1.3, 1.4 is connected to the input P− of its own module 12 and an input P+ of a different adjacent module.

The monitoring and control unit 15 is adapted for measuring an instantaneous electrical parameter of the associated energy storage module 12, e.g. the voltage across the P+ and P−. In order to obtain this, the balancing and monitoring unit 15 is provided with suitable measurement circuitry. In an embodiment of the present invention, this measurement circuitry can be an analog input of an analog to digital converter, e.g. of a local microcontroller 18 present in the monitoring and control unit 15.

The monitoring and control unit 15 according to this embodiment of the present invention furthermore comprises an input terminal V for receiving an input signal. This input terminal is electrically connected, over a switch SW to one P+ of the inputs P+, P− of module 12. The input signal V is received from an AC signal generator 14. Actuation of the switch SW can be controlled by a local controller 18.

Switch SW is preferably a controllable switch. Examples of controllable switches can be TIACs or transistors such as bipolar transistors, MOSFETs. The closed time for these switches can be set, e.g. by a user.

According to this embodiment of the present invention, all modules 12 can be coupled to the AC signal generator 14. This AC signal generator 14 can be a block wave generator, a sinusoidal signal source, a saw tooth generator, or any other type of AC signal generator. It is advantageous if the AC signal generator 14 is a high frequency signal generator, as this reduces component size. A sinusoidal signal generator is more efficient, has lower peak currents hence lower heat generation, and does not substantially present any switching losses. However, a block wave generator is easier to implement than a sinusoidal signal generator. The AC signal generator 14 can be powered from an external source (not illustrated), e.g. a charger. The AC signal generator 14 can be controlled by a main controller 20. It is advantageous to have a single AC signal generator 14 for all of the modules 12.

According to this embodiment of the present invention, each of the modules 12 is coupled to the AC signal generator 14 by means of a capacitor 19. The capacitive coupling provided by the capacitors 19 is used to block common mode voltages. This is required because the modules 12 are at different and varying potential levels.

In accordance with this embodiment of the present invention, a measuring circuit may digitize the measured values, e.g. voltages, and transmit them to the local controller 18. The measured parameter value, e.g. voltage, when the switch SW is closed and when it is open. If this comparison identifies a difference then this is an indication that there is a poor, bad or faulty connection.

All of the embodiments of the present invention are capable of detecting discontinuities, i.e. carrying out a connectivity check by opening and closing the switch SW and measuring the cell voltage.

For example, in all embodiments if all connections are good, i.e. no bad connections:

All the monitoring and control circuits measure the cell voltages with switch SW open, For a connectivity check the monitoring and control circuit 15 closes switch SW during a short time. As switch SW is controllable the switch activation time is controllable. Switch activation time is advantageously not very long. The capacity of the monitor cell which comprises a rechargeable energy storage cell such as an ultracapacitor, or one or more battery cells, is so large that for a time that the switch SW is closed, that is required for a measurement to be made, no significant difference is observed between the voltage measurements with open switch and voltage measurements with closed switch. For the short time that the switch SW needs to be closed charging of the rechargeable energy storage cell such as a battery or ultracapacitor is negligible. Hence the controllable switch SW does not need to be left on for such a time that the rechargeable energy storage cell is charged to a significant amount, i.e. for a detectable voltage change. A typical value would be that the switch is closed for 400 microsec with a maximum charge current being 200 mA. Such a small charging energy would make no change to the cell voltage of the rechargeable energy storage cell.

All the switches SW can be closed at the same time.

When all connections are intact the real cell voltages are measured and there is no change in voltage measurements through the monitoring circuit when switch SW is open and SW is closed for a connection check.

Operation of embodiments of the present invention is illustrated by the following examples.

Figure 4:
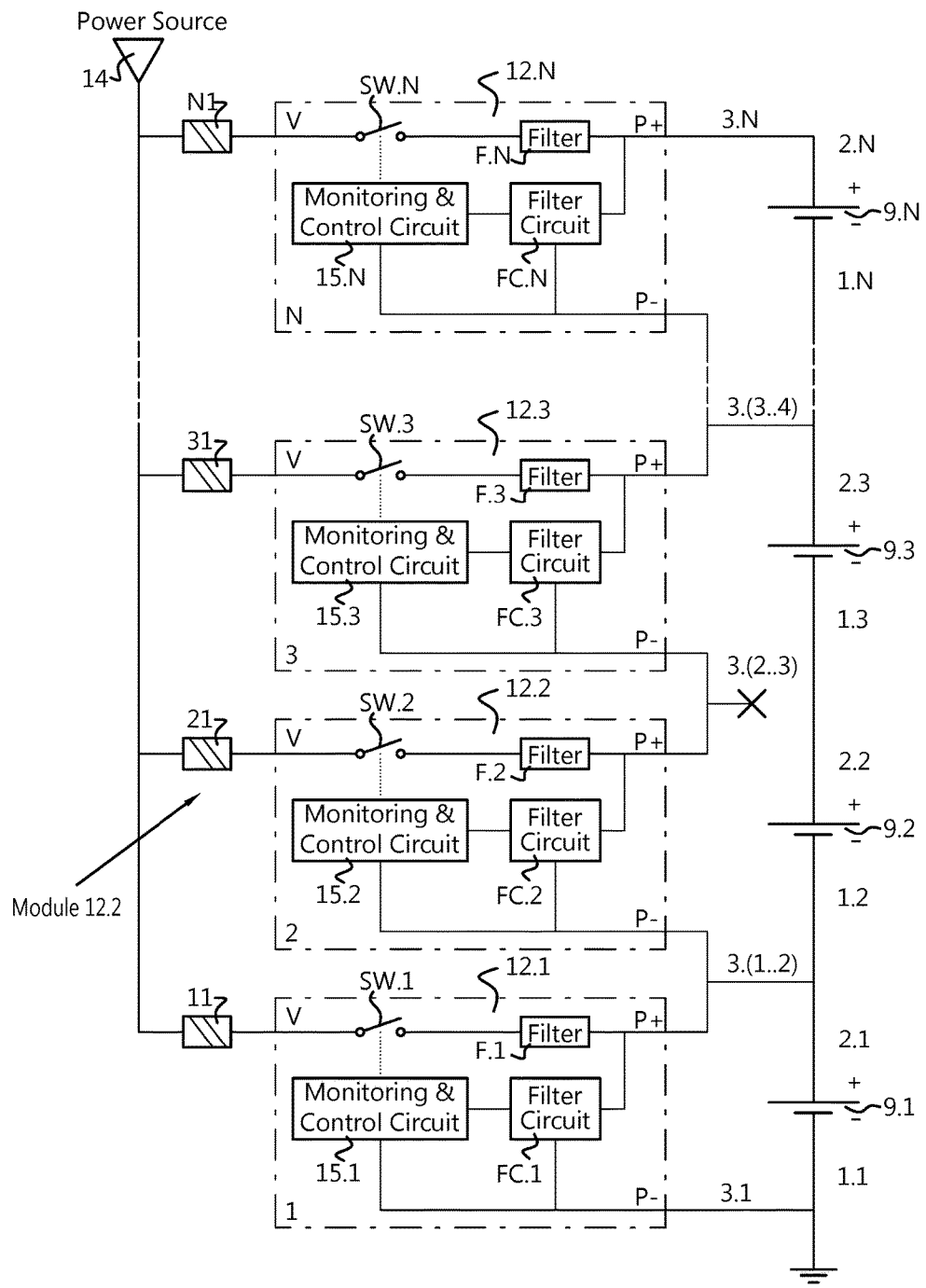
FIGS. 4 to 6 show bad connections which can be detected by embodiments of the present invention.

Example 1, if there is bad connection to the electronics e.g. see FIG. 4 (Common Wire 3.(2 . . . 3))

Common wire 3.(2 . . . 3) gives a bad connection (shown by a "Cross" indication).

For a connection check all switches SW are closed at the same time. As mentioned before the voltage V must be higher than the cell voltages.

The monitoring circuit from module 12.2 measures a voltage increase, SW is closed and the filter circuit FC.2 from module 12.2 is charged.

The voltage measured with monitoring and control unit 15.3 is decreased with SW closed. The voltage measured at module 12.3=voltage of Cell 9.2+voltage of Cell 9.3 (this is the fixed voltage formed by the cell voltages from cell 9.2 and cell 9.3)—voltage measured through monitoring and control circuit 15.2 of module 12.2.

In this case there is a deviation in the voltage measurements with SW open and SW closed. The deviation in the voltage measurement is an indication for a bad connection.

Figure 5:
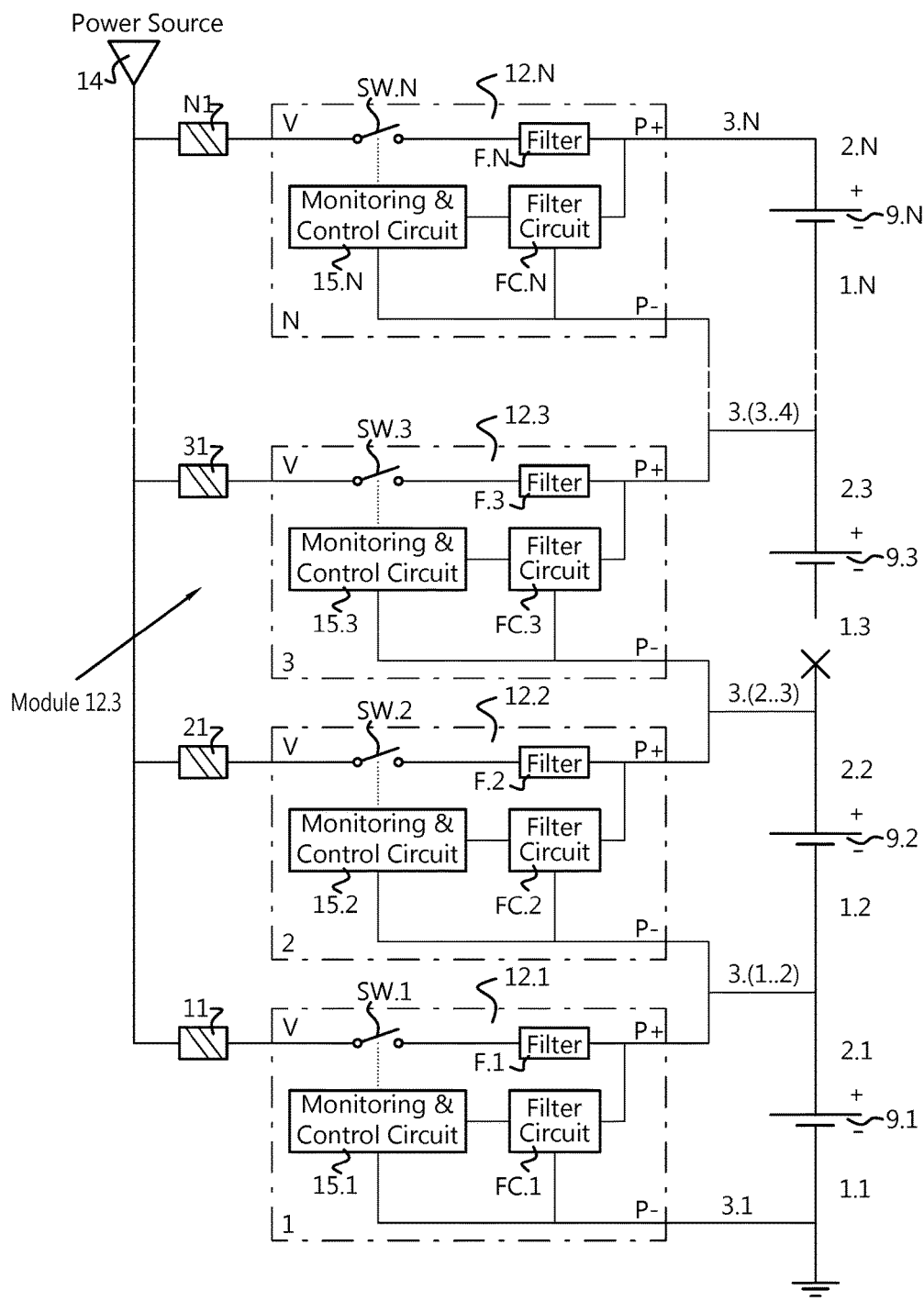

Example 2, bad connection to the minus terminal of a Cell: e.g. Cell 9.3 see FIG. 5:

When all SW are open: the voltage of Cell 9.1 Cell 9.2 are measured correctly through their monitoring and control circuits 15.1, 15.2. The measured voltage of Cell 9.3 is Low and not correct. The voltages above cell 9.3 are measured correctly through their monitoring and control circuits 15.4 and higher.

For connection check all switches SW are closed. The filter circuit FC.3 of module 12.3 is charged to voltage V; the measured voltage at monitoring and control device 15.3 is increasing to voltage V. There is a deviation in voltage measurement with SW open and SW closed and this deviation is an indication for a bad connection.

Figure 6:
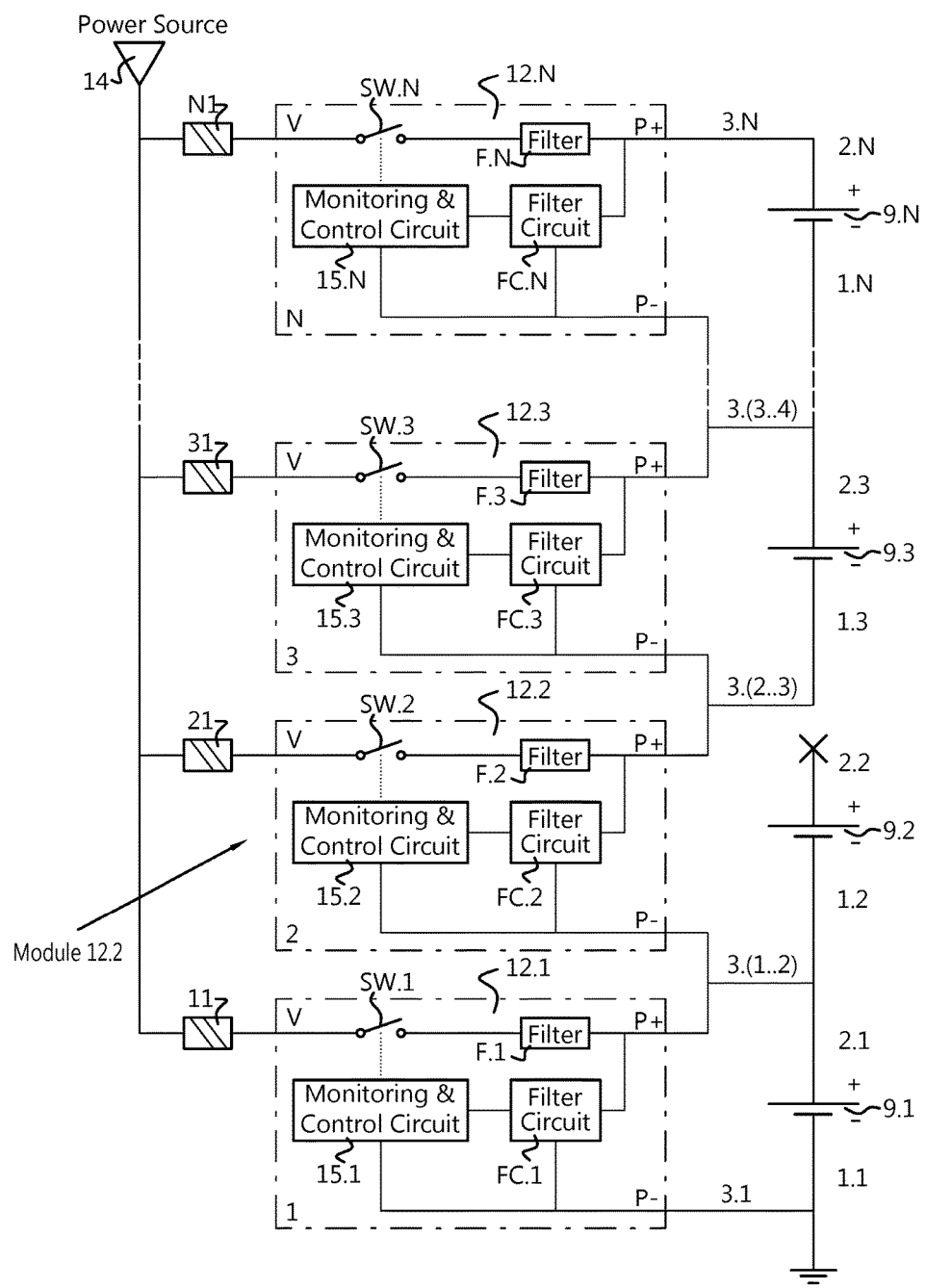

Example 3, bad connection to the plus terminal of a Cell: e.g. Cell 9.2—see FIG. 6

When all SW are open: the voltage of Cell 9.1 is measured correctly through the monitoring and control circuit 15.1. The measured voltages of Cell 9.2 is Low and not correct as measured by monitoring and control unit 15.2. The voltages above cell 9.2 are measured correctly through their monitoring and control circuits 15.3 and 15.4 and higher.

For connection check all switches SW are closed. The filter circuit FC.2 of module 12.2 is charged to voltage V; the measured voltage at monitoring and control unit 15.2 of module 12.2 is increasing to voltage V. There is a deviation in voltage measurement with SW open and SW closed and this deviation is an indication for a bad connection.

Figure 7:
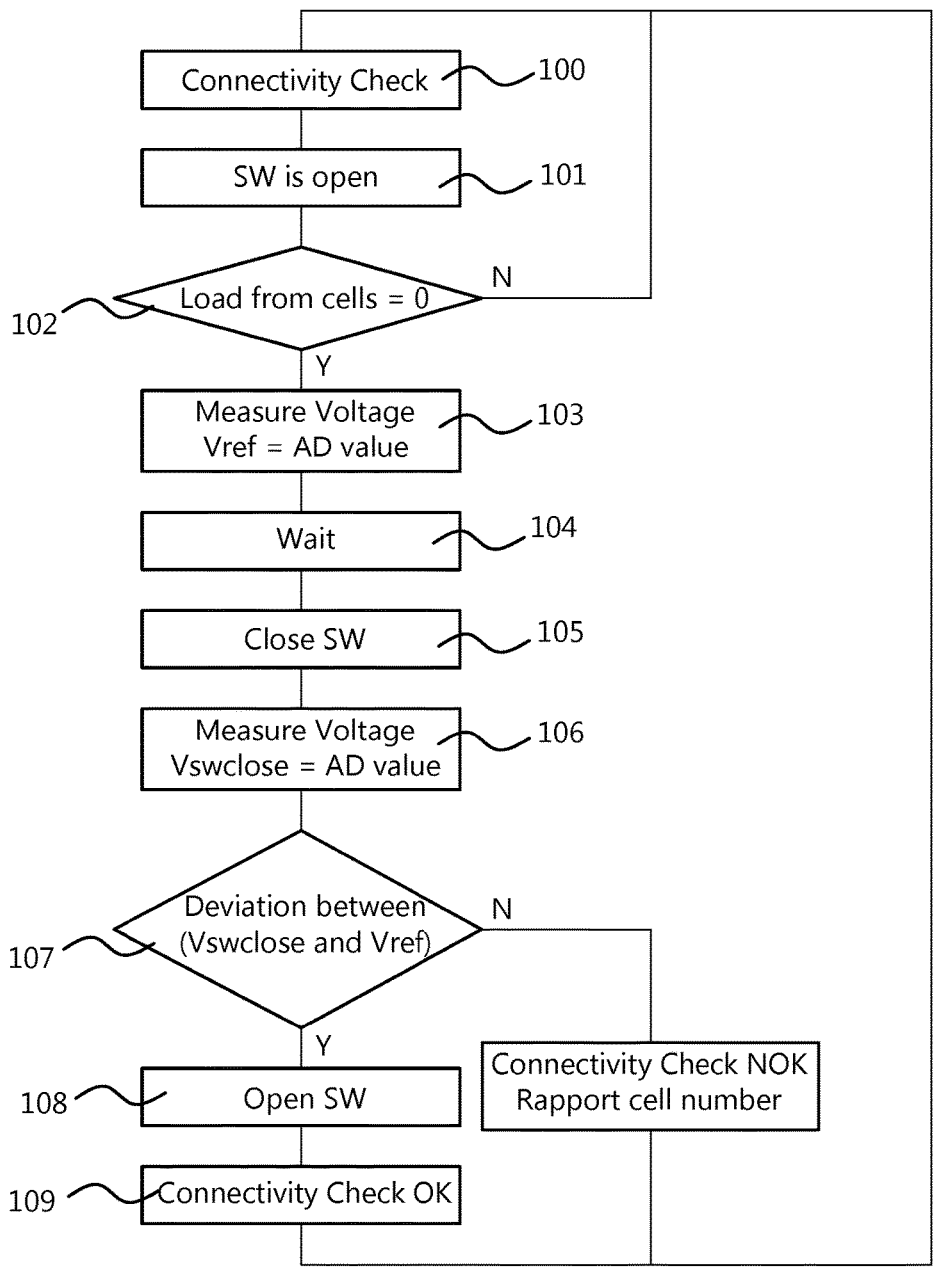
FIG. 7 is a flowsheet for a connectivity check for bad connections which can be detected by embodiments of the present invention

FIG. 7 gives a flowsheet for a connectivity check 100 that can be carried out with any of the embodiments of the present invention. In step 101, the switch SW of a module 12 is opened. In step 102 it is checked if there is a load from the cells which would compromise the result. If YES, the voltage is measured in step 103 by module 12 to give a first measured value followed by a waiting step 104. In step 105 the switch SW of the same module 12 is closed. In step 106 the voltage is again measured to provide a second measured value. In step 107 it is determined if there is a difference between the first and second measured values. If YES, there is a bad connection and an action is carried out. This action could be a report of the defective cell number or activating an alarm. If NO the connectivity check recommences with another cell. In step 108 the switch is opened. In step 109 the connectivity check is completed satisfactorily.

The present invention relates to a rechargeable energy storage system comprising: a string of rechargeable energy storage cell modules in series, each cell module comprising:
an individual rechargeable energy storage cell or plurality of rechargeable energy storage cells,
a controllable switch for use in a connection check,
a monitoring and control circuit adapted for measuring a cell module voltage, and
at least one filter circuit,
the rechargeable energy storage system further comprising:
a single common connection between a terminal of a rechargeable energy storage cell and the monitoring and control circuit within each module.

A controller can be provided to at least control the controllable switch, and the controller has processing capability such as provided by one or more microprocessors, FPGA's, or a central processing unit (CPU) and/or a Graphics Processing Unit (GPU), and can be adapted to carry out their respective functions by being programmed with software, i.e. one or more computer programmes.

Such a controller may have memory (such as non-transitory computer readable medium, RAM and/or ROM), an operating system, optionally a display such as a fixed format display, data entry devices such as a keyboard, a pointer device such as a "mouse", serial or parallel ports to communicate other devices, network cards and connections to connect to any of the networks.

Software can be adapted to perform a method for the reconfiguration of a rechargeable energy storage such as batteries, hybrids such as LiCaps, ultracapacitors or supercapacitors, fuel cells or similar comprising modules with controllable switches and a single common connection between a terminal of a rechargeable energy storage cell and a monitoring and control circuit within each module.

The software can be embodied in a computer program product adapted to carry out the following functions when the software is loaded onto the controller and executed on one or more processing engines such as microprocessors, ASIC's, FPGA's etc.:
opening the switch in one module,
measuring a cell voltage in the module to give a first measured value
closing the switch
measuring the cell voltage to provide a second measured value, and
determining if there is a difference between the first and second measured values. A difference would indicative a bad connection.

The software can be embodied in a computer program product adapted to carry out the following functions when the software is loaded onto the controller and executed on one or more processing engines such as microprocessors, ASIC's, FPGA's etc.:
Storing a defective cell number,
Generating a report of the defective cell or
activating an alarm.

Any of the above software may be implemented as a computer program product which has been compiled for a processing engine in any of the servers or nodes of the network. The computer program product may be stored on a non-transitory signal storage medium such as an optical disk (CD-ROM or DVD-ROM), a digital magnetic tape, a magnetic disk, a solid state memory such as a USB flash memory, a ROM, etc.

The invention claimed is:

1. A rechargeable energy storage system comprising a string of rechargeable energy storage cell modules in series, each cell module comprising:
   connections for connecting to an individual rechargeable energy storage cell or plurality of rechargeable energy storage cells,
   a controllable switch for use in a connection check,
   a monitoring and control circuit adapted for measuring a cell module voltage, and
   a filter circuit,
   the rechargeable energy storage system further comprising:
   a single common connection between a terminal of a rechargeable energy storage cell and the monitoring and control circuit within each module,
   wherein the rechargeable energy storage system is adapted such that when all connections of the rechargeable energy storage system are intact, there is no change in voltage measurements through the monitoring and control circuit when the switch is open and when the switch is closed, whereas a deviation in the voltage measurements measured by the monitoring and control circuit when the switch is open and closed is an indication of a bad connection, wherein the switch is closed and the filter circuit is charged in case of a bad connection.

2. The rechargeable energy storage system according to claim 1, whereby all the switches of the cell modules are closed at the same time and that all the monitoring and control circuits of the cell modules measure the cell voltages with the switches open.

3. The rechargeable energy storage system according to claim 1, wherein the controllable switch is selected from:
   the controllable switch being for control of when a module is to be balanced and
   the controllable switch being for transfer of charge from the power source to the cell associated with the module where the switch is located.

4. The rechargeable energy storage system according to claim 1, wherein the single common connection is connected between a terminal of a rechargeable energy storage cell and two analog inputs of two monitoring and control circuits in different modules.

5. The rechargeable energy storage system according to claim 1, further comprising a filter connected between the switch and an analog input of a module.

6. The rechargeable energy storage system according to claim 1, wherein the bad connections are selected from a bad connection in the single common connection and a bad connection in a terminal of a cell.

7. The rechargeable energy storage system according to claim 1, further comprising a power source selected from:
   the power source being connected to an input of each module and the switch, and
   the power source being connected to an input of each module and the switch and a galvanic isolation being connected between the power source and the input of each module and its switch.

8. The rechargeable energy storage system according to claim 1, wherein the filter circuit is an inductor connected between the switch and an analog input to the module where the switch is located.

9. The rechargeable energy storage system according to claim 1, configured to assess whether a voltage deviation has a magnitude indicative of a bad connection.

10. The rechargeable energy storage system according to claim 1, wherein the closed time of the controllable switch is set.

11. A method of performing a connectivity check in a rechargeable energy storage system comprising a string of rechargeable energy storage cell modules in series, each cell module comprising:
    connections to an individual rechargeable energy storage cell or plurality of rechargeable energy storage cells,
    a switch for use in a connection check,
    a monitoring and control circuit adapted for measuring a cell module voltage, and
    a filter circuit,
    the rechargeable energy storage system further comprising:
    a single common connection between a terminal of a rechargeable energy storage cell and the monitoring and control circuit within each module, the method comprising for each module:
    the switch is opened in one module,
    measure a cell voltage in the module to give a first measured value
    close the switch, wherein when the switch is closed the filter circuit is charged, if a bad connection is detected;
    measure the cell voltage to provide a second measured value, and
    determine if there is a voltage difference between the first and second measured values.

12. The method of claim 11, whereby all the switches of the cell modules are closed at the same time and that all the monitoring and control circuits of the cell modules measure the cell voltages with the switches open.

13. The method of claim 11, wherein a difference is indicative of a bad connection and an action is carried out, the action optionally being is a report of the defective cell number or activating an alarm.

14. The method of claim 11, wherein the bad connections are selected from a bad connection in the single common connection and a bad connection in a terminal of a cell.

15. The method of claim 11, further comprising operating the switches for control of when a module is to be balanced.

16. The method of claim 11, further comprising connecting the single common connection between a terminal of a rechargeable energy storage cell and two analog inputs of two monitoring and control circuits in different modules.

17. The method of claim 11, further comprising connecting a power source is selected from:
   connecting the power source to an input of each module and its switch and
   connecting the power source to an input of each module and its switch with a galvanic isolation between the power source and the input of each module and its switch.

18. The method according to claim 17, wherein the switch is for transfer of charge from the power source to the cell associated with the module where the switch is located.

19. The method of claim 11, further comprising connecting a filter selected from
   connecting a filter between the switch and an analog input of a module, and
   connecting a filter between the switch and an analog input of a module, the filter being an inductor connected between the switch and an analog input to the module where the switch is located.

20. A computer program product comprising software code segments, which when implemented on a processing engine, executes method of claim 11, wherein the computer program product is optionally stored on a non-volatile signal storage device.

* * * * *